United States Patent
Kent

(10) Patent No.: US 10,418,342 B1
(45) Date of Patent: Sep. 17, 2019

(54) SILICON STRIP FAN OUT SYSTEM IN PACKAGE

(71) Applicant: Dialog Semiconductor (UK) Limited, London (GB)

(72) Inventor: Ian Kent, Chippenham (GB)

(73) Assignee: Dialog Semiconductor (UK) Limited, London (GB)

(*) Notice: Subject to any disclaimer, the term of this patent is extended or adjusted under 35 U.S.C. 154(b) by 12 days.

(21) Appl. No.: 15/963,678

(22) Filed: Apr. 26, 2018

(51) Int. Cl.
| | |
|---|---|
| H01L 23/00 | (2006.01) |
| H01L 23/31 | (2006.01) |
| H01L 23/538 | (2006.01) |
| H01L 21/48 | (2006.01) |
| H01L 21/56 | (2006.01) |
| H01L 21/78 | (2006.01) |

(52) U.S. Cl.
CPC .......... *H01L 24/96* (2013.01); *H01L 21/4857* (2013.01); *H01L 21/4864* (2013.01); *H01L 21/561* (2013.01); *H01L 21/565* (2013.01); *H01L 21/78* (2013.01); *H01L 23/3114* (2013.01); *H01L 23/3128* (2013.01); *H01L 23/5383* (2013.01); *H01L 23/5386* (2013.01); *H01L 23/5389* (2013.01); *H01L 24/19* (2013.01); *H01L 24/20* (2013.01); *H01L 2224/214* (2013.01); *H01L 2924/19106* (2013.01); *H01L 2924/3511* (2013.01)

(58) Field of Classification Search
None
See application file for complete search history.

(56) References Cited

U.S. PATENT DOCUMENTS

| | | | |
|---|---|---|---|
| 5,879,964 A | * | 3/1999 | Paik ..................... H01L 23/3114 438/113 |
| 7,883,992 B2 | | 2/2011 | Furuta |
| 9,676,619 B2 | | 6/2017 | Zhao et al. |

* cited by examiner

*Primary Examiner* — Thien F Tran
(74) *Attorney, Agent, or Firm* — Saile Ackerman LLC; Stephen B. Ackerman; Rosemary L. S. Pike

(57) ABSTRACT

A method to fabricate a reconstructed panel based fan-out wafer level package is described. A reconstructed wafer panel is provided comprising a plurality of individual dies encapsulated in a first molding compound. Interconnected metal redistribution layers (RDL) separated by PSV layers are formed on top surfaces of the plurality of individual dies. Thereafter, the reconstructed wafer panel is cut into a plurality of rectangular strips. Thereafter, backend processing is performed on each of the plurality of rectangular strips.

14 Claims, 6 Drawing Sheets

US 10,418,342 B1

SILICON STRIP FAN OUT SYSTEM IN PACKAGE

(1) TECHNICAL FIELD

This disclosure is related to wafer packaging technologies, and more particularly, to wafer packaging technologies where back end processes are performed on silicon strips.

(2) BACKGROUND

Fan Out Chip Scale Systems in Package processed on panel type reconstructed wafers typically contain top and bottom side active and passive components encapsulated by top and bottom epoxy molding compound in either liquid or granular form. These packages are processed in full panel processes up to the final device singulation.

This panel level processing is inherently suseptable to total thickness variation and/or warpage, resluting in problematic backend processing, particularly in the steps including molding, back grinding, laser marking, laser ablation, ball placement, and singulation.

Typically, annealing and/or leveling of the reconstructed wafer in panel form is required multiple times throughout the process. The leveling/annealing is required because the multiple layering process for Fan Out Wafer Level Packaging uses different materials that have different Coefficents of Thermal Expansion (CTE) and glass transition temperatures (Tg), resulting in these material layers expanding and contracting at different rates, which causes the re-constructed wafer to warp. When the re-constructed wafer warps, it is not possible to process through the next process steps. This adds cost and cycle time. Furthermore, these annealing and/or leveling steps are not always effective in removing warpage or mold thickness variation and do not always result in a tighter tolerance capability. Thus, the process is impacted and the final packaging yield may be lower than optimal.

U.S. Pat. Nos. 9,676,619 (Zhao et al) and 7,883,992 (Furuta) teach methods of dicing a wafer into strips, but these processes have nothing to do with the process of the present disclosure.

SUMMARY

It is the primary objective of the present disclosure to provide an improved method of fabricating Re-constructed Panel Based Fan Out Systems in Package (SIP) where back end processes are performed on silicon strips.

In accordance with the objective of the present disclosure, a method to fabricate a fan-out wafer level package using a reconstructed panel is achieved. A reconstructed wafer panel is provided comprising a plurality of individual dies encapsulated in a first molding compound. Interconnected metal redistribution layers (RDL) separated by passivation (PSV) layers are formed on top surfaces of the plurality of individual dies. Thereafter, the reconstructed wafer panel is cut into a plurality of rectangular strips. Thereafter, backend processing is performed on each of the plurality of rectangular strips.

BRIEF DESCRIPTION OF THE DRAWINGS

In the accompanying drawings forming a material part of this description, there is shown.

DETAILED DESCRIPTION

The present disclosure provides an improved method for fabricating a Fan Out Wafer Level System In Package, processed using a panel level reconstructed wafer and having double sided passive and active components with top and bottom side molding. A key feature of the present disclosure is a silicon strip dicing process and backend processing on the silicon strips.

The silicon strip fan out system in package of the present disclosure is similar to the standard panel reconstructed wafer, but with additional or sufficient die spacing between the silicon strips, as defined by the Out-Sourced Assembly and Test (OSAT) standard strip handling equipment infrastructure. The spacing between the dies is called a dicing street. This additional/increased dicing street is needed to define an adequate area for the silicon strip to be processed or handled by the manufacturing equipment without damaging or impacting the die, for example in slot magazines and indexing equipment, strip pick and place type equipment, and other handling methods.

The process of the present disclosure includes dicing the reconstructed wafer in the die spacing dicing streets to generate silicon strips. Dicing is performed after the Fan Out redistribution layer (RDL) and passivation layer (PSV) processing steps are completed The reconstructed wafer panel is cut using a wafer dicing system, or similar, into rectangular strips. The rectangular strips are processed through the backend processes using existing OSAT equipment handling systems and infrastructure. Due to the reduced surface area, the silicon strip will exhibit less warpage. This will allow automated processing of the silicon strips and less manual handling and will lead to a higher yield as a result.

The process of the present invention will be described in more detail with reference to FIGS. 1-19. Processing begins with a typical fan-in process to prepare a reconstructed wafer panel. A front-end processed wafer is diced and chips are placed on a carrier and covered with a molding compound to form an artificial or reconstructed or reconstituted wafer in panel form. Due to warpage, there is a need for the reconstructed wafer to be annealed and leveled. The annealing and leveling process is used to flatten or otherwise improve the planarity of the wafer to reduce the warpage.

Figure 1:
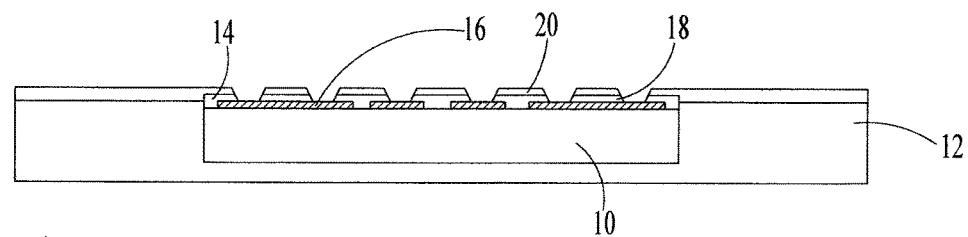
FIGS. 1-8 and 11-19 are cross-sectional representations of steps in a process to fabricate the fan out wafer level package of the present disclosure.

FIG. 1 illustrates a portion of a reconstructed wafer showing a die 10 surrounded by molding compound 12. During the fan-in process, if required, first passivation (PSV) layer 14, metal redistribution layer (RDL) 16, and second passivation layer 18 were formed. Now, in the fan-out process, a third passivation layer 20 is coated over the wafer and patterned to form openings to the first RDL layer 16.

Figure 2:
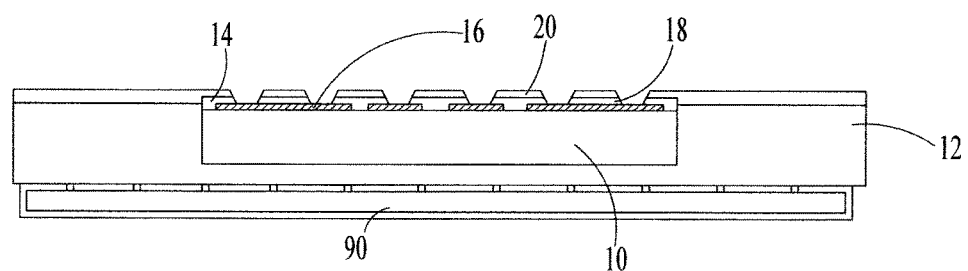

Now, a leveling step is performed, as shown in FIG. 2. The wafer is manually placed onto a vacuum table 90. The wafer is then heated from above and below at different temperatures. With the vacuum applied, the wafer's warpage reduces at the peak temparature and the wafer is then cooled down, the vacuum keeping the new or improved planarity of the wafer. The wafer is then manually returned to the manufacturing process for its next processing step.

Figure 3:
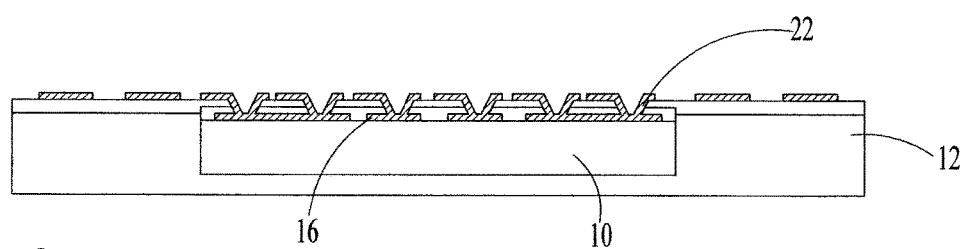
Figure 4:
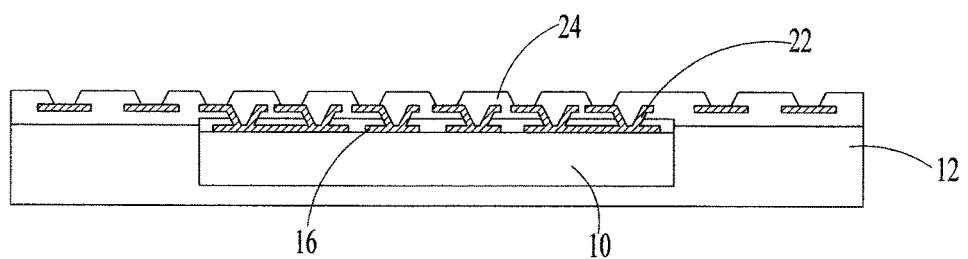
Figure 5:
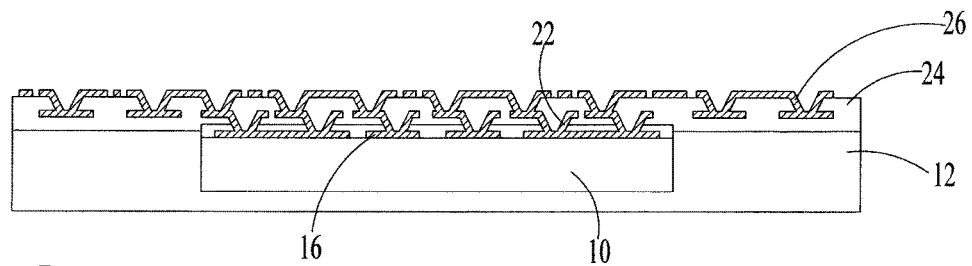
Figure 6:
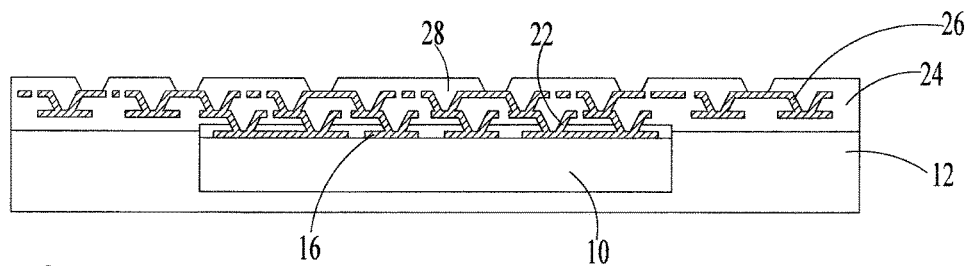
Figure 7:
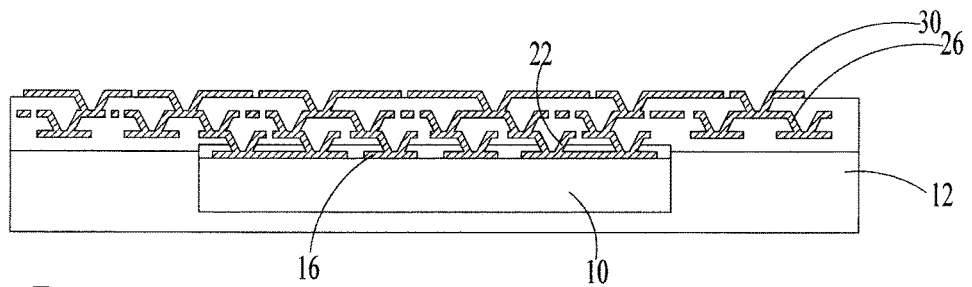
Figure 8:
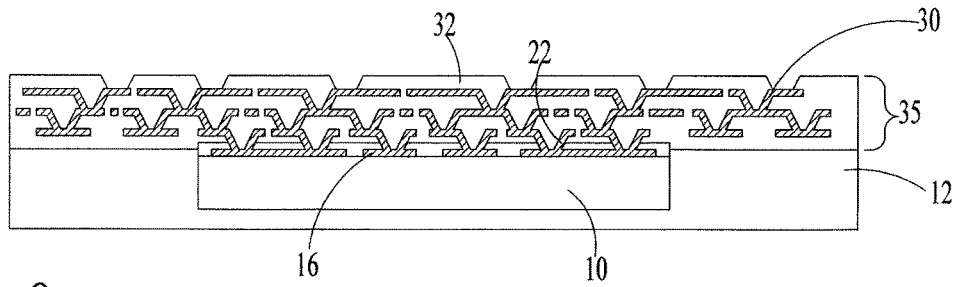

Next, as shown in FIG. 3, a second RDL layer 22 is deposited and patterned. Several layers of PSV and RDL materials are built up and interconnected as shown in the next few figures. PSV layer 24 is coated and patterned in FIG. 4, RDL layer 26 is deposited and patterned in FIG. 5, PSV layer 28 is coated and patterned in FIG. 6, RDL layer 30 is deposited and patterned in FIG. 7, and PSV layer 32 is coated and patterned in FIG. 8.

Figure 9:
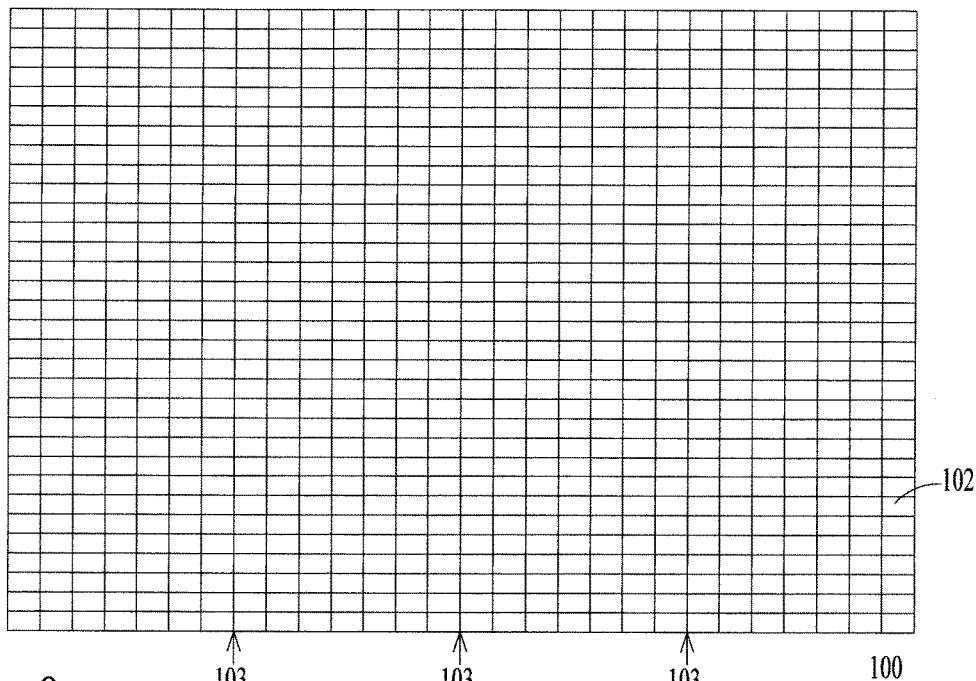
FIG. 9 is a top view of the individual dies in a reconstructed wafer panel of the present disclosure.
Figure 10:
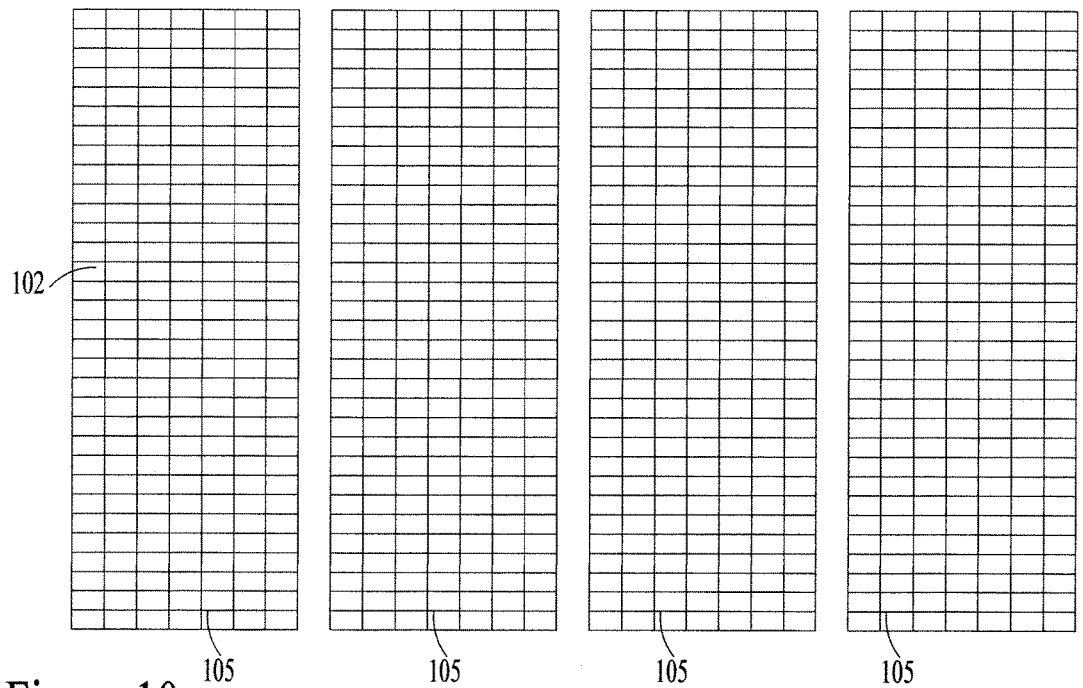
FIG. 10 is a top view of the reconstructed wafer panel of the present disclosure cut into rectangular strips.

FIG. 9 illustrates a top view of the reconstructed wafer 100 in panel form showing the individually cut dies 102 that form the reconstructed wafer. After all the RDL layers have been fabricated on the wafer 100, in a key feature of the present disclosure, the panel reconstructed wafer 100 is cut using a wafer dicing system, or similar, into rectangular strips 105, as shown in FIG. 10. The silicon strips are then processed through the backend processes using existing OSAT equipment handling systems and infrastructure. The silicon strips 105 can be transported in standard slot magazines and processed through existing backend equipment.

It is necessary that additional or sufficient die spacing 103 is provided between the silicon strips so that the silicon strips can be handled by the manufacturing equipment without damaging or impacting the dies. The die spacing between strips will vary depending upon the "die to strip edge" clearance required by the equipment handling and can differ due to varying equipment manufacturers.

Figure 11:
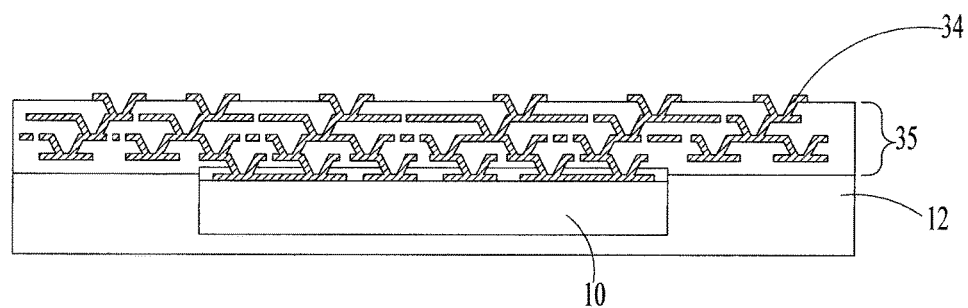
Figure 12:
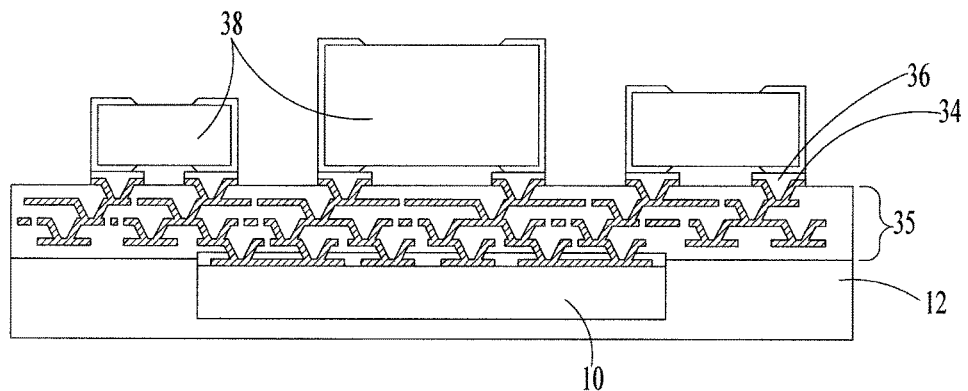

The backend processing begins with depositing and patterning under bump metal (UBM) layer 34, as illustrated in FIG. 11. Next, devices 38 are mounted onto the die using surface mount technology (SMT) such as solder attachment 36, as shown in FIG. 12.

Figure 13:
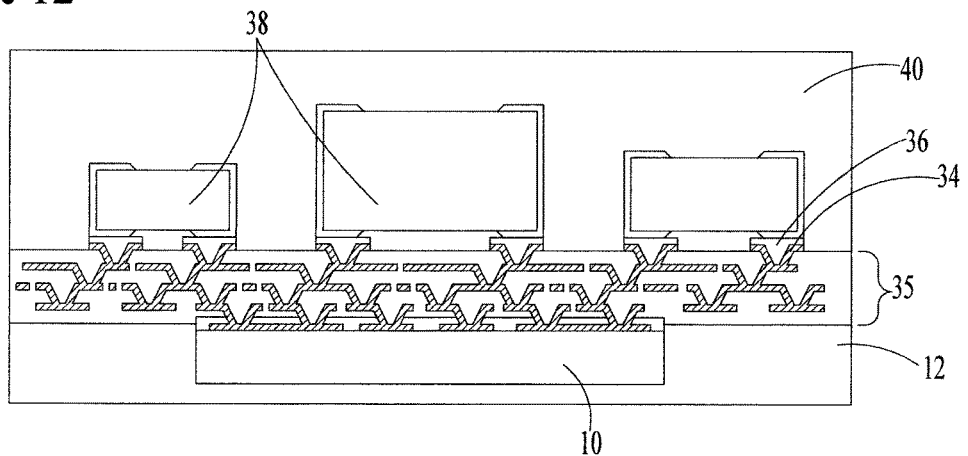
Figure 14:
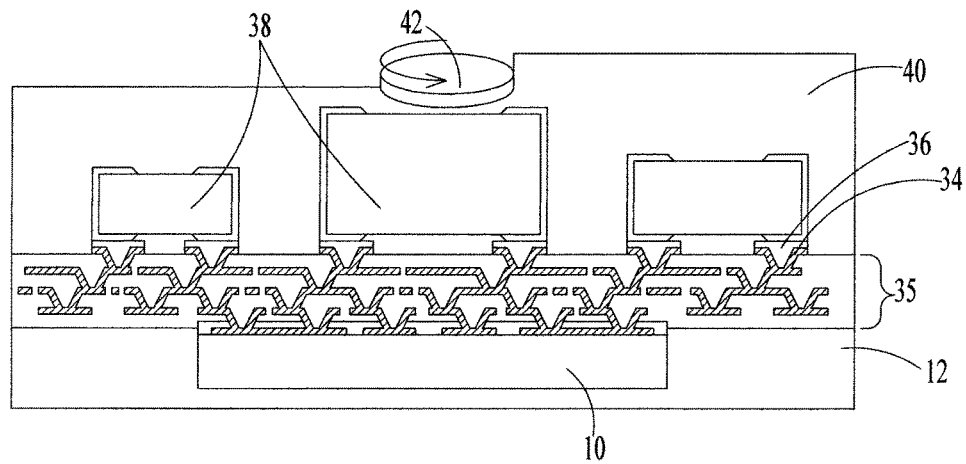
Figure 15:
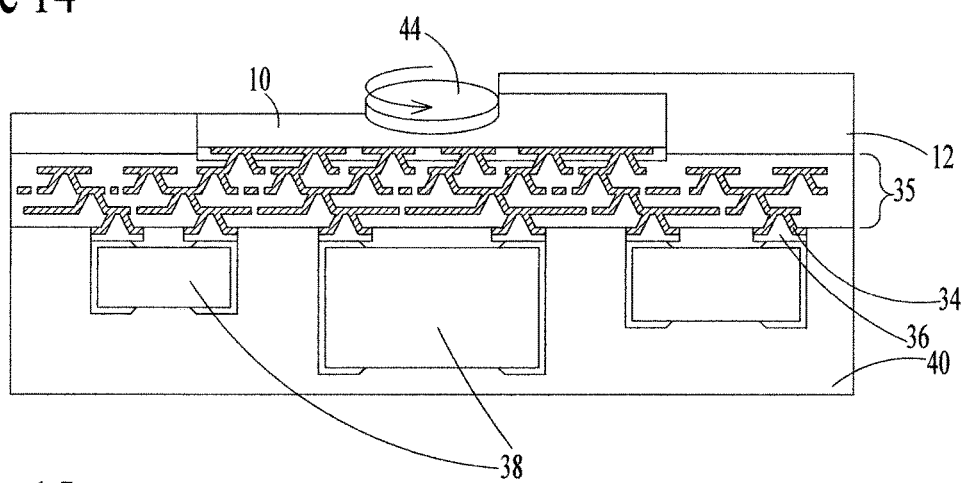

As shown in FIG. 13, a second molding compound 40 is coated over the devices 38, then mold underfill lapping (MUF) 42 is performed, in FIG. 14, to define the final thickness of the molding compound to meet the final package requirements defined per end user platform and by end customers. Next, according to FIG. 15, MUF lapping 44 is performed on the opposite side of the panel to expose the silicon die 10.

Figure 16:
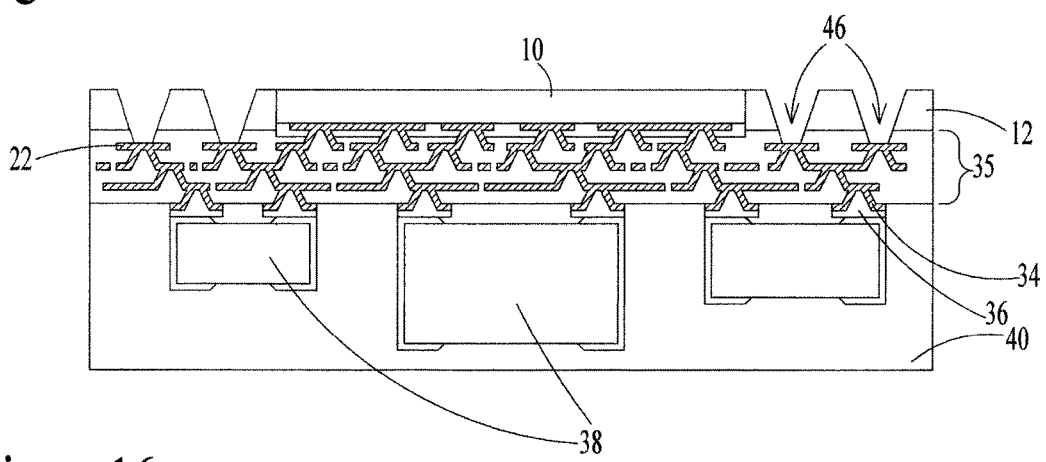

Now, as shown in FIG. 16, through mold vias (TMV) are formed through the mold compound 12 on the die side by laser drilling and marking to expose RDL layer 22. In the prior art, it is necessary to insert an additional leveling step here. But, in the process of the present disclosure, since this backend processing is performed on the silicon strips rather than on the full panel reconstructed wafer, additional leveling is not necessary.

Figure 17:
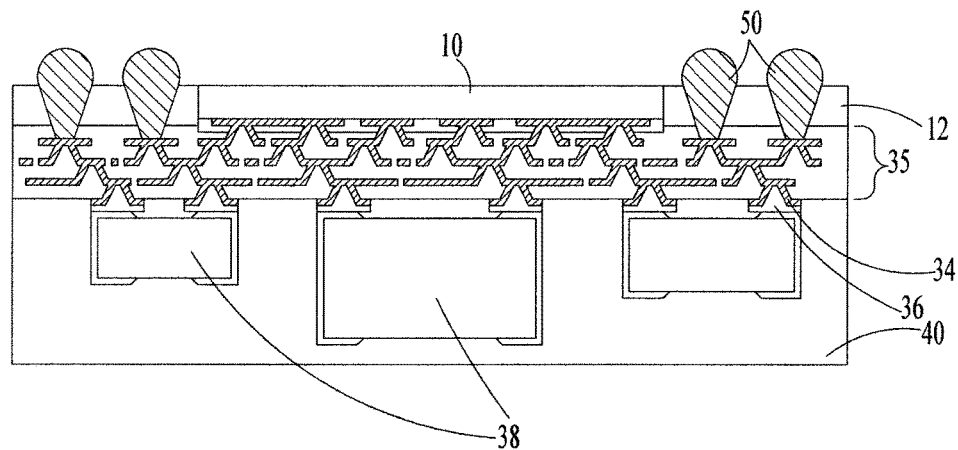
Figure 18:
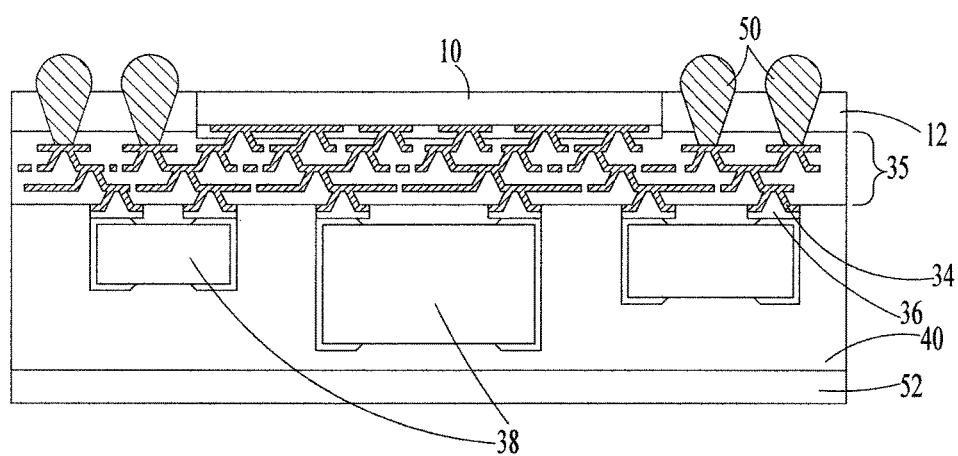

As illustrated in FIG. 17, after etching inside the TMV's 46 to clean the solder ball pads 22, solder balls 50 are placed in the TMV's. The strips 105 are attached to a dicing tape 52, as shown in FIG. 18, to enable them to be processed in a dicing system. Then, the strips are singulated into individual dies 102., as shown in FIG. 19.

Further backend processing includes open short sampling, final visual inspection, crack inspection, final test, dry bake, and packing.

With the generation of the silicon strips, the re-constructed wafer processing and wafer warpage are removed. The silicon strips can also be processed using existing equipment infrastructure, whereas the reconstructed wafers in panel form need specific fan-out wafer level package equipment. Processing at the silicon strip level also enables better alignment and accuracy for processing because the processing area and compound tolerances are reduced.

Figure 19:
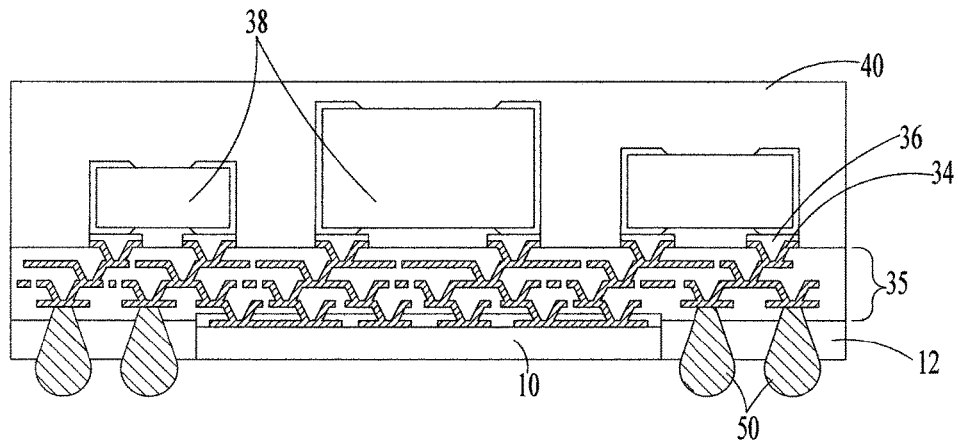

FIG. 19 illustrates the completed fan-out wafer level package fabricated according to the process of the present disclosure. Passive components 38 contact UBM layer 34. UBM layer 34 contacts the topmost of the interconnected RDL layers separated by PSV layers in 35. The active die 10 connects to the RDL layers at the bottom of the package. On either side of the die, solder balls 50 connect through holes in the molding compound 12 to the RDL layers in 35.

The fan out wafer level package of the present disclosure, where backend processing is performed on rectangular silicon strips, has less warpage and higher yield than similar packages where all fabrication is performed on the wafer panel. The process of the present disclosure can use the existing backend equipment infrastructure, so less equipment investment is required.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method of fabricating a fan out wafer level package comprising:
   providing a reconstructed wafer panel comprising a plurality of individual dies encapsulated in a first molding compound;
   forming interconnected metal redistribution layers (RDL) separated by passivation layers on top surfaces of said plurality of individual dies;
   thereafter, cutting said reconstructed wafer panel into a plurality of rectangular strips; and
   thereafter performing backend processing on each of said plurality of rectangular strips.

2. The method according to claim 1 wherein said backend processing comprises:
   forming an under bump metal (UBM) layer contacting a topmost said RDL layer;
   attaching devices to said UBM layer using surface mount technology;
   covering said devices in a second molding compound.
   lapping said second molding compound and lapping said first molding compound to expose a bottom surface of said individual dies;
   forming through mold vias through said first molding compound to contact said topmost RDL layer;
   placing solder balls in said through mold vias; and
   thereafter singulating said individual dies.

3. The method according to claim 1 wherein leveling steps are required on said reconstructed wafer panel and wherein leveling steps are not required after said reconstructed wafer has been cut into said rectangular strips.

4. The method according to claim 3 wherein said leveling steps comprise:
   placing said wafer onto a vacuum table;
   heating said wafer from above and below at different temperatures wherein under vacuum, warpage of said wafer reduces at a peak temparature; and
   thereafter cooling said wafer wherein said vacuum maintains an improved planarity of said wafer.

5. The method according to claim 1 wherein sufficient die spacing is provided between said rectangular strips so that said rectangular strips can be handled by manufacturing equipment without damaging or impacting said dies.

6. A method of fabricating a fan out wafer level package comprising:

providing a reconstructed wafer panel comprising a plurality of individual dies encapsulated in a first molding compound;

forming interconnected metal redistribution layers (RDL) separated by passivation layers on top surfaces of said plurality of individual dies;

thereafter, cutting said reconstructed wafer panel into a plurality of rectangular strips; and thereafter performing backend processing on each of said plurality of rectangular strips; and thereafter dicing said plurality of rectangular strips into said individual dies.

7. The method according to claim 6 wherein said backend processing comprises:

forming an under bump metal (UBM) layer contacting a topmost said RDL layer;

attaching devices to said UBM layer using surface mount technology;

covering said devices in a second molding compound.

lapping said second molding compound and lapping said first molding compound to expose a bottom surface of said individual dies;

forming through mold vias through said first molding compound to contact said topmost RDL layer; and placing solder balls in said through mold vias.

8. The method according to claim 6 wherein leveling steps are required on said reconstructed wafer panel and wherein leveling steps are not required after said reconstructed wafer has been cut into said rectangular strips.

9. The method according to claim 8 wherein said leveling steps comprise:

placing said wafer onto a vacuum table;

heating said wafer from above and below at different temperatures wherein under vacuum, warpage of said wafer reduces at a peak temperature; and thereafter cooling said wafer wherein said vacuum maintains an improved planarity of said wafer.

10. The method according to claim 6 wherein sufficient die spacing is provided between said rectangular strips so that said rectangular strips can be handled by manufacturing equipment without damaging or impacting said dies.

11. A method of fabricating a fan out wafer level package comprising:

providing a reconstructed wafer panel comprising a plurality of individual dies encapsulated in a first molding compound;

forming interconnected metal redistribution layers (RDL) separated by passivation layers on top surfaces of said plurality of individual dies;

thereafter, cutting said reconstructed wafer panel into a plurality of rectangular strips;

thereafter performing backend processing on each of said plurality of rectangular strips wherein leveling steps are required on said reconstructed wafer panel and wherein leveling steps are not required after said reconstructed wafer has been cut into said rectangular strips; and thereafter dicing said plurality of rectangular strips into said individual dies.

12. The method according to claim 11 wherein said backend processing comprises:

forming an under bump metal (UBM) layer contacting a topmost said RDL layer;

attaching devices to said UBM layer using surface mount technology;

covering said devices in a second molding compound.

lapping said second molding compound and lapping said first molding compound to expose a bottom surface of said individual dies;

forming through mold vias through said first molding compound to contact said topmost RDL layer; and placing solder balls in said through mold vias.

13. The method according to claim 11 wherein said leveling steps comprise:

placing said wafer onto a vacuum table;

heating said wafer from above and below at different temperatures wherein under vacuum, warpage of said wafer reduces at a peak temperature; and thereafter cooling said wafer wherein said vacuum maintains an improved planarity of said wafer.

14. The method according to claim 11 wherein sufficient die spacing is provided between said rectangular strips so that said rectangular strips can be handled by manufacturing equipment without damaging or impacting said dies.

* * * * *